United States Patent
Motoyama et al.

(10) Patent No.: US 12,433,170 B2
(45) Date of Patent: Sep. 30, 2025

(54) MRAM STRUCTURE WITH A T-SHAPED FERROMAGNETIC LAYER

(71) Applicant: INTERNATIONAL BUSINESS MACHINES CORPORATION, Armonk, NY (US)

(72) Inventors: Koichi Motoyama, Clifton Park, NY (US); Oscar van der Straten, Guilderland Center, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 616 days.

(21) Appl. No.: 17/814,244

(22) Filed: Jul. 22, 2022

(65) Prior Publication Data
US 2024/0032438 A1    Jan. 25, 2024

(51) Int. Cl.
*H10N 50/80* (2023.01)
*H10B 61/00* (2023.01)
*H10N 50/01* (2023.01)

(52) U.S. Cl.
CPC ............ *H10N 50/80* (2023.02); *H10B 61/00* (2023.02); *H10B 61/10* (2023.02); *H10N 50/01* (2023.02)

(58) Field of Classification Search
CPC ........ H10N 50/10; H10N 80/10; H10N 50/01; H10N 50/80; H10B 61/00
See application file for complete search history.

(56) References Cited

U.S. PATENT DOCUMENTS

| | | | |
|---|---|---|---|
| 8,048,685 B2 | 11/2011 | Boivin | |
| 8,273,666 B2 | 9/2012 | Xiao | |
| 9,431,602 B2 | 8/2016 | Nagel | |
| 9,542,987 B2 | 1/2017 | Naik | |
| 9,553,257 B1 | 1/2017 | Annunziata | |
| 9,559,294 B2 | 1/2017 | Hsu | |
| 9,666,790 B2 * | 5/2017 | Chuang | H10N 50/01 |
| 9,905,751 B2 | 2/2018 | Diaz | |
| 2016/0308119 A1 | 10/2016 | Hsu | |

* cited by examiner

*Primary Examiner* — Christine S. Kim
*Assistant Examiner* — Tyler J Wiegand
(74) *Attorney, Agent, or Firm* — Yuanmin Cai (57) ABSTRACT

Embodiments of present invention provide a method of forming a MRAM structure. The method includes forming a bottom electrode layer surrounded by a bottom dielectric layer; forming an etch-stop layer on top of the bottom electrode layer and the bottom dielectric layer; creating an opening in the etch-stop layer to expose a top surface of the bottom electrode layer; forming a first ferromagnetic layer on top of the bottom electrode layer and the etch-stop layer, with a portion of the first ferromagnetic layer filling the opening in the etch-stop layer; forming a tunnel barrier layer and a second ferromagnetic layer on top of the first ferromagnetic layer; patterning the second ferromagnetic layer, the tunnel barrier layer, and the first ferromagnetic layer; and forming a top electrode layer on top of the second ferromagnetic layer. A structure formed thereby is also provided.

19 Claims, 10 Drawing Sheets

MRAM STRUCTURE WITH A T-SHAPED FERROMAGNETIC LAYER

BACKGROUND

The present application relates to manufacturing of semiconductor integrated circuits. More particularly, it relates to method of forming a magnetoresistive random access memory and the structure formed thereby.

With the explosion of digital information, semiconductor memory devices are playing an ever increasingly important role in the managing and organizing of this digital information through storing, retrieving, and/or transformation of this digital information. Magnetoresistive random-access memory (MRAM) is a type of non-volatile memory (NVM) capable of holding saved data even in the event that power to the memory is down or is accidentally cut off. There have been several recent developments in the technology that allow MRAM to be used successfully in specific emerging applications, as well as in not-so-new ones.

MRAM technology is based on a component known as magnetic tunnel junction (MTJ) that consists of two ferromagnetic layers separated by an insulating layer known as a tunnel barrier layer. In a vertical MRAM device, a top and a bottom electrode compliment the MTJ to form a vertical MTJ stack. The vertical MTJ stack is usually formed by the patterning of a stack of blanket layers corresponding to the above MTJ stack. In other words, the stack of blanket layers may be etched through a reactive ion etching (RIE) and/or ion beam etching (IBE) process. However, such etching process may sometimes come with re-sputtering effect, which causes metal elements from, for example, the blanket bottom electrode layer to be re-deposited onto sidewall surfaces of the ferromagnetic layers and/or the tunnel barrier layer that are above the bottom electrode layer, resulting shorts between the two ferromagnetic layers that should be otherwise isolated from each other by the tunnel barrier layer.

SUMMARY

Embodiments of present invention provide a MRAM structure. The MRAM structure includes a magnetic tunnel junction (MTJ) stack, the MTJ stack comprising a bottom electrode layer, a first ferromagnetic layer, a tunnel barrier layer, a second ferromagnetic layer, and a top electrode layer; and a dielectric layer of silicon-carbon-nitride (SiCN) between the bottom electrode layer and the first ferromagnetic layer, wherein the dielectric layer has an opening directly above the bottom electrode layer, a portion of the first ferromagnetic layer filling the opening and being in contact with the bottom electrode layer.

In one embodiment, the first ferromagnetic layer has a first sidewall, a height of the first sidewall being smaller than a height of the first ferromagnetic layer measured at a center thereof. In another embodiment, the first ferromagnetic layer has a second sidewall that is surrounded by the opening of the dielectric layer.

In one embodiment, the first sidewall of the first ferromagnetic layer is substantially coplanar with sidewalls of the tunnel barrier layer, the second ferromagnetic layer, and the top electrode layer. In another embodiment, the first sidewall is not coplanar with a sidewall of the bottom electrode layer.

In one embodiment, the first ferromagnetic layer is either a reference layer or a free layer of the MTJ stack of the MRAM structure.

In another embodiment, the MRAM structure further includes a sidewall spacer, the sidewall spacer surrounding a first sidewall shared by the first and second ferromagnetic layers, the tunnel barrier layer, and the top electrode layer; and the sidewall spacer being directly on top of the dielectric layer.

Embodiments of present invention also provide a method of forming a MRAM structure. The method includes forming a bottom electrode layer, the bottom electrode layer being coplanar with a bottom dielectric layer that surrounds the bottom electrode layer; forming an etch-stop layer on top of the bottom electrode layer and the bottom dielectric layer; creating an opening in the etch-stop layer to expose a top surface of the bottom electrode layer; forming a first ferromagnetic layer on top of the exposed top surface of the bottom electrode layer and on top of the etch-stop layer, with a portion of the first ferromagnetic layer filling the opening in the etch-stop layer; forming a tunnel barrier layer and a second ferromagnetic layer on top of the first ferromagnetic layer; patterning the second ferromagnetic layer, the tunnel barrier layer, and the first ferromagnetic layer; and forming a top electrode layer on top of the second ferromagnetic layer.

In one embodiment, patterning the second ferromagnetic layer, the tunnel barrier layer, and the first ferromagnetic layer includes patterning the second ferromagnetic layer, the tunnel barrier layer, and the first ferromagnetic layer to have a common sidewall, where the common sidewall is not coplanar with a sidewall of the bottom electrode layer.

One embodiment of present invention further provides forming a sidewall spacer next to the common sidewall, where a bottom of the sidewall spacer directly contacts the etch-stop layer.

In one embodiment, the first ferromagnetic layer has a first sidewall and a second sidewall, the second sidewall being surrounded by the opening in the etch-stop layer and not coplanar with the first sidewall.

In another embodiment, patterning the second ferromagnetic layer, the tunnel barrier layer, and the first ferromagnetic layer includes using the top electrode layer as a metal hard mask in an anisotropic etching process to etch the second ferromagnetic layer, the tunnel barrier layer, and the first ferromagnetic layer.

In one embodiment, the anisotropic etching process stops at the etch-stop layer, the etch-stop layer prevents the anisotropic etching process from further etching of the bottom electrode layer.

In another embodiment, forming the bottom electrode layer includes forming the bottom electrode layer on top of a metal level of a back-end-of-line (BEOL) structure.

BRIEF DESCRIPTION OF THE DRAWINGS

The present invention will be understood and appreciated more fully from the following detailed description of embodiments of present invention, taken in conjunction with accompanying drawings of which.

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity, or they are embodied in a single physical entity.

DETAILED DESCRIPTION

In the below detailed description and the accompanying drawings, it is to be understood that various layers, structures, and regions shown in the drawings are both demonstrative and schematic illustrations thereof that are not drawn to scale. In addition, for the ease of explanation, one or more layers, structures, and regions of a type commonly used to form semiconductor devices or structures may not be explicitly shown in a given illustration or drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

To provide spatial context to different structural orientations of the semiconductor structures shown in the drawings, XYZ Cartesian coordinates may be provided in some of the drawings. The terms "vertical" or "vertical direction" or "vertical height" as used herein denote a Z-direction of the Cartesian coordinates shown in the drawings, and the terms "horizontal" or "horizontal direction" or "lateral direction" as used herein denote an X-direction and/or a Y-direction of the Cartesian coordinates shown in the drawings.

Moreover, although various reference numerals may be used across different drawings, the same or similar reference numbers are used throughout the drawings to denote the same or similar features, elements, or structures, and thus detailed explanations of the same or similar features, elements, or structures may not be repeated for each of the drawings for economy of description. Labelling for the same or similar elements in some drawings may be omitted as well in order not to overcrowd the drawings.

Figure 1:
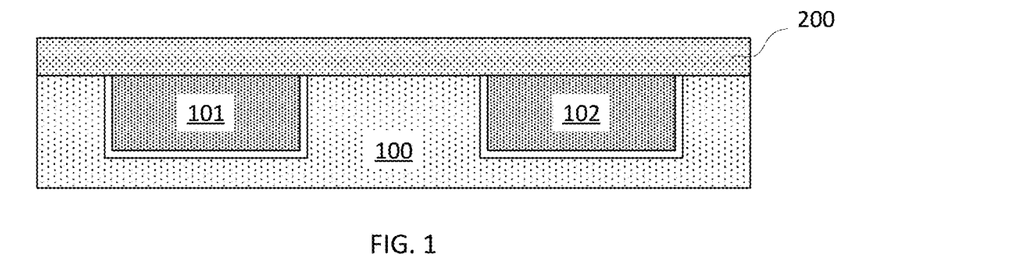
FIGS. 1-13 are demonstrative illustrations of cross-sectional views of a MRAM structure in a process of manufacturing thereof according to one embodiment of present invention.

FIG. 1 is a demonstrative illustration of cross-sectional view of a MRAM structure in a step of manufacturing thereof according to one embodiment of present invention. The MRAM structure may include magnetic tunnel junction (MTJ) stacks and the MTJ stacks may be, in one embodiment, in a substantially cylindrical form or shape. Cross-sectional views illustrated hereinafter may be views of cross-sections made substantially along a diameter of the cylindrical form or shape of the MTJ stacks of the MRAM structure.

More particularly, embodiments of present invention provide forming one or more bottom contacts of a MRAM structure 10 (see FIG. 13) or a MRAM structure 20 (see FIG. 17) such as bottom contacts 101 and 102 in a first dielectric layer 100. The bottom contacts 101 and 102 may be part of a metal level such as, for example, a metal level M2, M3, etc. and the first dielectric layer 100 may be an interlevel dielectric (IDL) layer. The bottom contacts 101 and 102, together with the first dielectric layer 100, may be part of a back-end-of-line (BEOL) structure.

Embodiments of present invention may further provide forming a blanket bottom electrode layer 200 of the MRAM structure 10 or 20 on top of the bottom contacts 101 and 102 and the first dielectric layer 100. In one embodiment, the blanket bottom electrode layer 200 may be a layer of tantalum-nitride (TaN) or titanium-nitride (TiN). The blanket bottom electrode layer 200 may be formed to have a thickness ranging from about 20 nm to about 100 nm.

Figure 2:
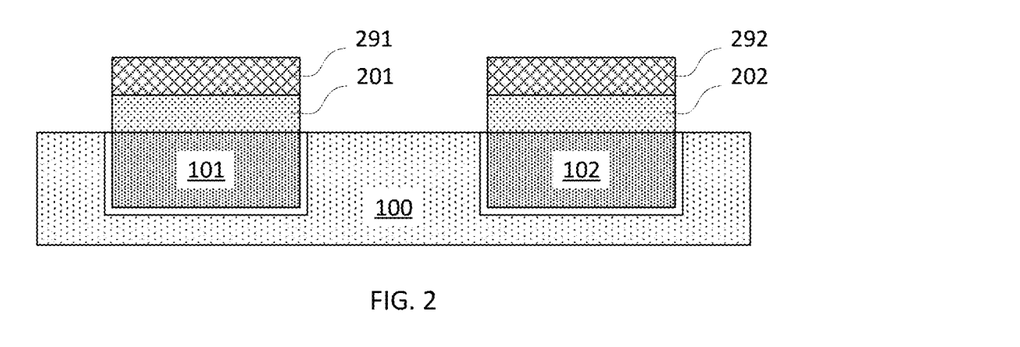

FIG. 2 is a demonstrative illustration of cross-sectional view of a MRAM structure in a step of manufacturing thereof, following the step illustrated in FIG. 1, according to one embodiment of present invention. More particularly, embodiments of present invention provide forming hard masks such as, for example, hard masks 291 and 292 on top of the blanket bottom electrode layer 200 through a lithographic patterning process. The pattern of the hard masks 291 and 292 are subsequently transferred into the blanket bottom electrode layer 200, through for example an anisotropic etching process, to form bottom electrode layers 201 and 202.

Figure 3:
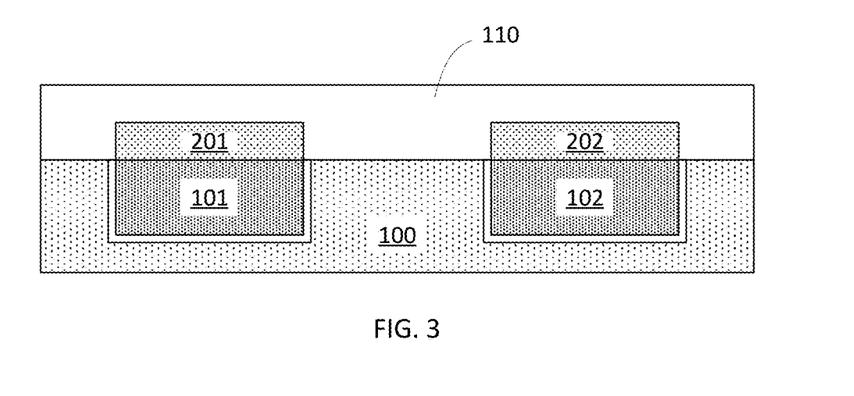

FIG. 3 is a demonstrative illustration of cross-sectional view of a MRAM structure in a step of manufacturing thereof, following the step illustrated in FIG. 2, according to one embodiment of present invention. More particularly, embodiments of present invention provide, after forming the bottom electrode layers 201 and 202, removing or lifting the hard masks 291 and 292 and subsequently forming a second dielectric layer 110 to cover the bottom electrode layers 201 and 202 and the first dielectric layer 100. The second dielectric layer 110 may be formed or deposited onto the bottom electrode layers 201 and 202 and the first dielectric layer 100 through a chemical-vapor-deposition (CVD) process, an atomic-layer-deposition (ALD) process, a physical-vapor-deposition (PVD), and/or other suitable means.

Figure 4:
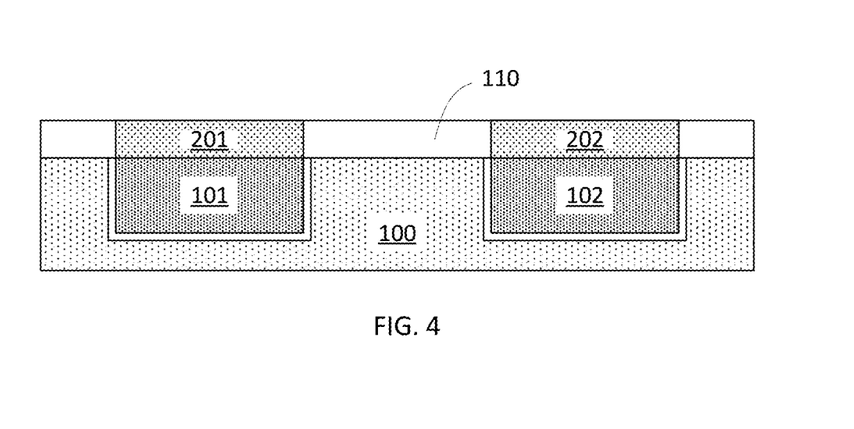

FIG. 4 is a demonstrative illustration of cross-sectional view of a MRAM structure in a step of manufacturing thereof, following the step illustrated in FIG. 3, according to one embodiment of present invention. More particularly, embodiments of present invention provide planarizing the second dielectric layer 110 to be coplanar with top surfaces of the bottom electrode layers 201 and 202. The planarization of the second dielectric layer 110 may be made through a chemical-mechanic-polishing (CMP) process polishing the surface of the second dielectric layer 110 all the way down to the top surfaces of the bottom electrode layers 201 and 202. Alternatively, the second dielectric layer 110 may first be, optionally, polished to have a flat top surface and subsequently subjected to a recessing etching process until the top surfaces of the bottom electrode layers 201 and 202 are exposed.

Figure 5:
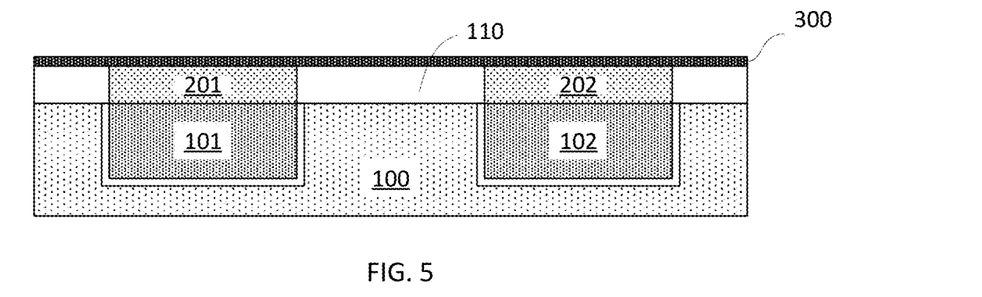

FIG. 5 is a demonstrative illustration of cross-sectional view of a MRAM structure in a step of manufacturing thereof, following the step illustrated in FIG. 4, according to one embodiment of present invention. More particularly, embodiments of present invention provide forming a blanket etch-stop layer 300 directly on top of the top surfaces of the bottom electrode layers 201 and 202 and the second dielectric layer 110. The blanket etch-stop layer 300 may be a dielectric layer such as, for example, a silicon-carbonitride (SiCN) layer and may be formed to have a thickness ranging from about 1 nm to about 10 nm. However, embodiments of preset invention are not limited in this aspect and other suitable materials such as, for example, silicon-nitride (SiN), silicon-oxycarbonitride (SiOCN), silicon-oxynitride (SiON), aluminum-oxynitride (AlON), aluminum-oxide ($Al_2O_3$), zirconium-oxide ($ZrO_2$), and silicon-oxide ($SiO_2$) may be used as etch-stop layer as well. The blanket etch-stop layer 300 may cover at least the top surfaces of the bottom electrode layers 201 and 202, thereby may prevent the underneath bottom electrode layers 201 and 202 from being etched in a subsequent etching process in forming MTJ stacks, as being described below in more details. According to embodiment of present invention, the use of the etch-stop layer 300 eliminates concerns of potential re-sputtering of the bottom electrode layers 201 and 202 onto the ferromagnetic layers formed thereupon that would otherwise cause shorts between the ferromagnetic layers in a MTJ stack of the MRAM structure.

Figure 6:
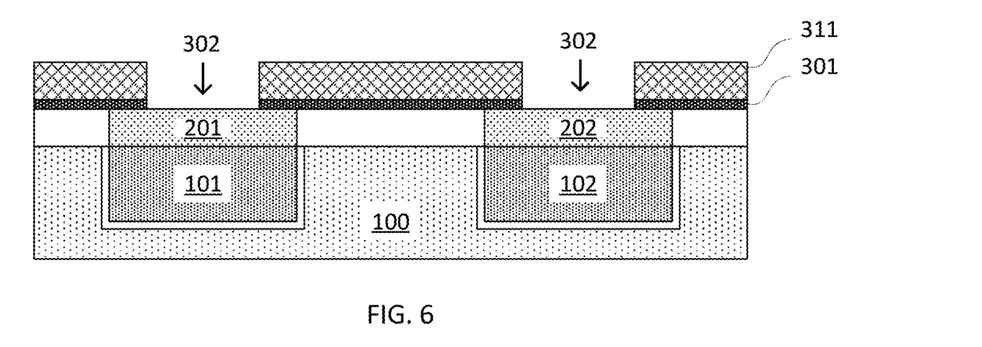

FIG. 6 is a demonstrative illustration of cross-sectional view of a MRAM structure in a step of manufacturing thereof, following the step illustrated in FIG. 5, according to one embodiment of present invention. More particularly, embodiments of present invention provide forming a hard mask such as, for example, a hard mask 311 on top of the blanket etch-stop layer 300 and subsequently transferring, through an etching process, the pattern of the hard mask 311 into the blanket etch-stop layer 300 to form an etch-stop layer 301. The etch-stop layer 301 may include openings 302 that are created directly on top of the bottom electrode layers 201 and 202. The openings 302 expose the top surfaces of the bottom electrode layers 201 and 202.

Figure 7:
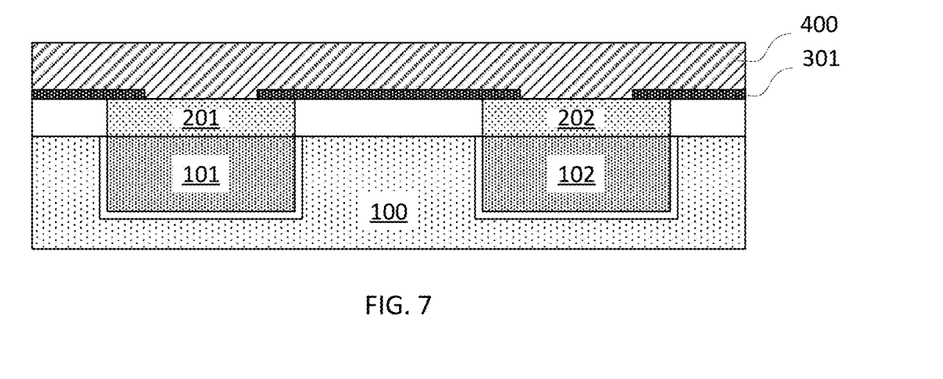

FIG. 7 is a demonstrative illustration of cross-sectional view of a MRAM structure in a step of manufacturing thereof, following the step illustrated in FIG. 6, according to one embodiment of present invention. More particularly, embodiments of present invention provide removing the hard mask 311 to expose the etch-stop layer 301, and subsequently forming a blanket first ferromagnetic layer 400 on top of the exposed top surfaces of the bottom electrode layers 201 and 202 and the etch-stop layer 301. In one embodiment, the first ferromagnetic layer may be a layer of cobalt (Co), iron (Fe) and boron (B) based material (CoFeB) such as, for example, an alloy of Co, Fe, and B, although other types of ferromagnetic material such as an alloy of Co and Fe (CoFe) or an alloy of nickel (Ni) and Fe (NiFe) may be used as well. The blanket first ferromagnetic layer 400 may be formed to have a thickness ranging from about 2 nm to about 30 nm, at least thicker than the openings 302 to completely fill the openings 302.

Figure 8:
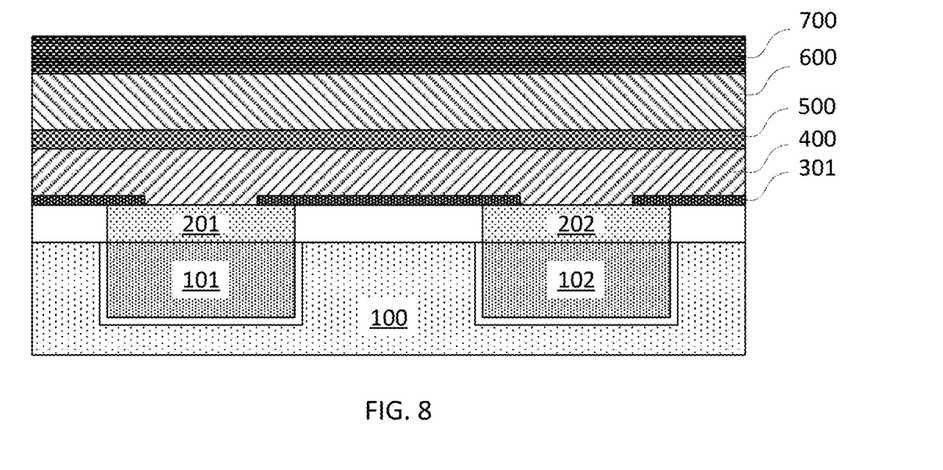

FIG. 8 is a demonstrative illustration of cross-sectional view of a MRAM structure in a step of manufacturing thereof, following the step illustrated in FIG. 7, according to one embodiment of present invention. More particularly, embodiments of present invention provide forming a blanket tunnel barrier layer 500 on top of the blanket first ferromagnetic layer 400; and forming a blanket second ferromagnetic layer 600 on top of the blanket tunnel barrier layer 500. Embodiments of present invention may further deposit a blanket metal hard mask layer 700 on top of the blanket second ferromagnetic layer 600.

In one embodiment, the blank tunnel barrier layer 500 may be a layer of magnesium oxide (MgO) or other suitable materials including $Al_2O_3$, $TiO_2$ and may be formed have a thickness ranging from about 0.6 nm to about 1.2 nm. The blanket second ferromagnetic layer 600 may be a blanket layer of alloy of Co, Fe, and B, an alloy of Co and Fe, or an alloy of Ni and Fe, similar to the blanket first ferromagnetic layer 400, and may be formed to have a thickness ranging from about 2 nm to about 30 nm. The blanket metal hard mask layer 700 may be formed to include conductive material such as, for example, tantalum (Ta), TaN, titanium (Ti), TiN, or ruthenium (Ru) and have a thickness ranging from about 5 nm to about 100 nm.

Figure 9:
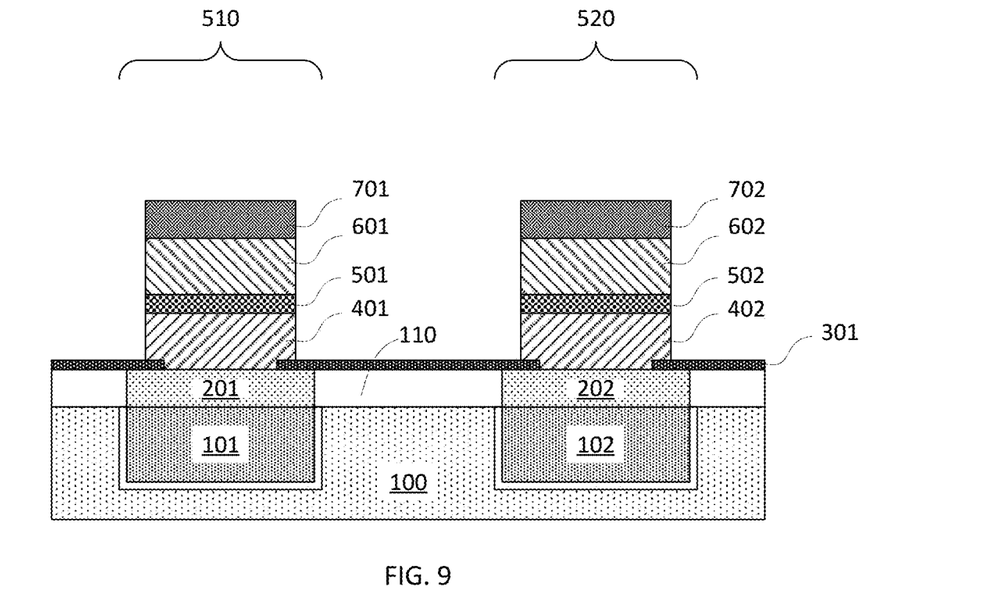

FIG. 9 is a demonstrative illustration of cross-sectional view of a MRAM structure in a step of manufacturing thereof, following the step illustrated in FIG. 8, according to one embodiment of present invention. More particularly, embodiments of present invention provide patterning the blanket metal hard mask layer 700 into metal hard masks 701 and 702. Subsequently, the metal hard masks 701 and 702 may be used in patterning, through one or more anisotropic and selective etching processes, the underneath blanket layers into second ferromagnetic layers 601 and 602, tunnel barrier layers 501 and 502, and first ferromagnetic layers 401 and 402. The selective etching process may stop at the etch-stop layer 301, which prevents the underneath bottom electrode layers 201 and 202 from being etched to cause short between the first and second ferromagnetic layers. The short would otherwise be caused due to re-sputtering of the conductive materials of the bottom electrode layers 201 and 202 onto sidewalls of the first ferromagnetic layers 401 and 402 and the second ferromagnetic layers 601 and 602.

The metal hard mask 701, the second ferromagnetic layer 601, the tunnel barrier layer 501, the first ferromagnetic layer 401, the bottom electrode layer 201, and together with a top electrode layer 801 formed later (see FIG. 13), may form a first MTJ stack 510. Similarly, the metal hard mask 702, the second ferromagnetic layer 602, the tunnel barrier layer 502, the first ferromagnetic layer 402, the bottom electrode layer 202, and together with a top electrode layer 802 formed layer (see FIG. 13), may form a second MTJ stack 520.

According to one embodiment of present invention, in the first MTJ stack 510, the first ferromagnetic layer 401 may be a reference layer, whose magnetic direction is fixed, and the second ferromagnetic layer 601 may be a free layer, whose magnetic direction may be changed. Alternatively, the first ferromagnetic layer 401 may be a free layer and the second ferromagnetic layer 601 may be a reference layer. Similarly, according to another embodiment, in the second MTJ stack 520, the first ferromagnetic layer 402 may be a reference layer, whose magnetic direction is fixed, and the second ferromagnetic layer 602 may be a free layer, whose magnetic direction may be changed. Alternatively, the first ferromagnetic layer 402 may be a free layer and the second ferromagnetic layer 602 may be a reference layer.

The magnetic direction of a free layer of a MTJ stack may be changed by applying a magnetic field or a polarized current. Hereinafter, in order to avoid redundance, description and/or discussion may be focused on one MTJ stack such as, for example, the first MTJ stack 510. Nevertheless, similar description and/or discussion may be applied to other MTJ stacks such as, for example, the second MTJ stack 520.

Figure 10:
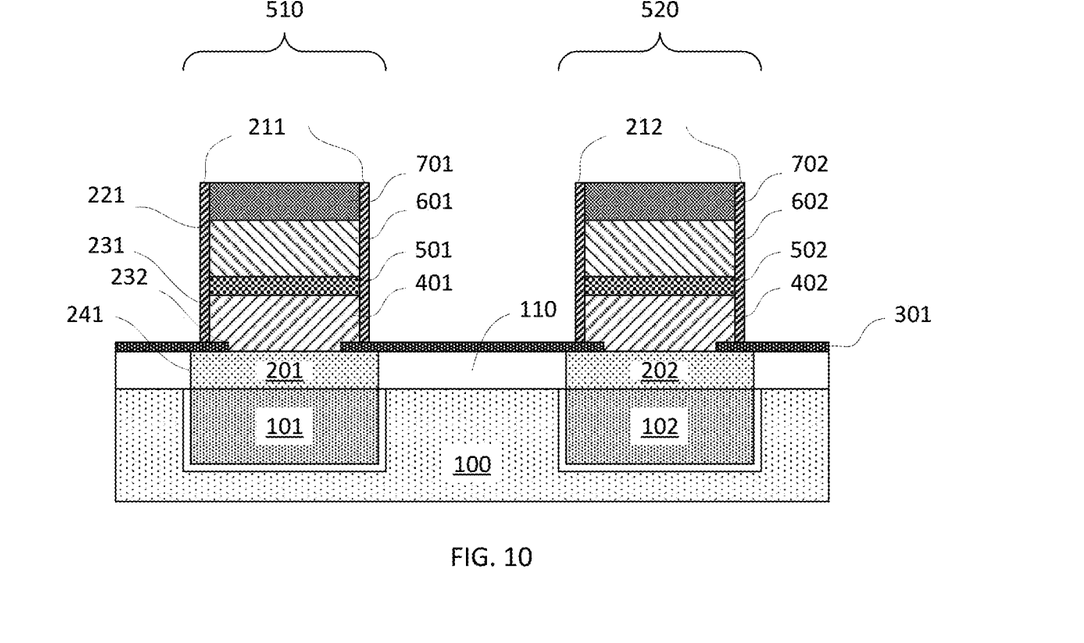

FIG. 10 is a demonstrative illustration of cross-sectional view of a MRAM structure in a step of manufacturing thereof, following the step illustrated in FIG. 9, according to one embodiment of present invention. More particularly, embodiments of present invention provide forming a sidewall spacer 211 next to sidewalls of the first ferromagnetic layer 401, the tunnel barrier layer 501, the second ferromagnetic layer 601, and the metal hard mask 701. A bottom of the sidewall spacer 211 may be directly on top of the etch-stop layer 301.

The first ferromagnetic layer 401 may have a first sidewall 231 and a second sidewall 232. The first sidewall 231 of the first ferromagnetic layer 401 and sidewalls of the tunnel barrier layer 501 and the second ferromagnetic layer 601 may be substantially coplanar with each other to form a common sidewall, referenced hereinafter as a common sidewall 221. In other words, the common sidewall 221 is shared by the first ferromagnetic layer 401, the tunnel barrier layer 501, and the second ferromagnetic layer 601. The second sidewall 232, formed by a portion of the first ferromagnetic layer 401, may be inside the openings 302 and surrounded by the openings 302 of the etch-stop layer 301. A height of the first sidewall 231 of the first ferromagnetic layer 401 may be smaller than a height of the first ferromagnetic layer 401, that is an overall thickness of the first ferromagnetic layer 401, as being measured at a center thereof.

In other words, a cross-sectional view of the first ferromagnetic layer 401 may have a T-shape with a horizontal portion of the T-shape being above the etch-stop layer 301 and a vertical portion of the T-shape, below the horizontal portion, inside the openings 302 of the etch-stop layer 301. The horizontal portion of the T-shape of the first ferromagnetic layer 401 has the first sidewall 231 and the vertical portion of the T-shape of the first ferromagnetic layer 401 has the second sidewall 232.

The bottom electrode layer 201 may have a sidewall 241. According to one embodiment of present invention, the common sidewall 221 shared by the first ferromagnetic layer 401, the tunnel barrier layer 501, and the second ferromagnetic layer 601 may not be coplanar with the sidewall 241 of the bottom electrode layer 201. For example, in one embodiment, a width (or diameter) of the first ferromagnetic layer 401 may be smaller than that of the bottom electrode layer 201. The sidewall 241 of the bottom electrode layer 201 may encompass the common sidewall 221 and, for example, the first sidewall 231 of the first ferromagnetic layer 401. The sidewall spacer 211 may be made of silicon-nitride (SiN) although other suitable material may be used as well.

Similarly, as is illustrated for the second MTJ stack 520, a sidewall spacer 212 may be formed next to sidewalls of the first ferromagnetic layer 402, the tunnel barrier layer 502, the second ferromagnetic layer 602, and the metal hard mask 702.

Figure 11:
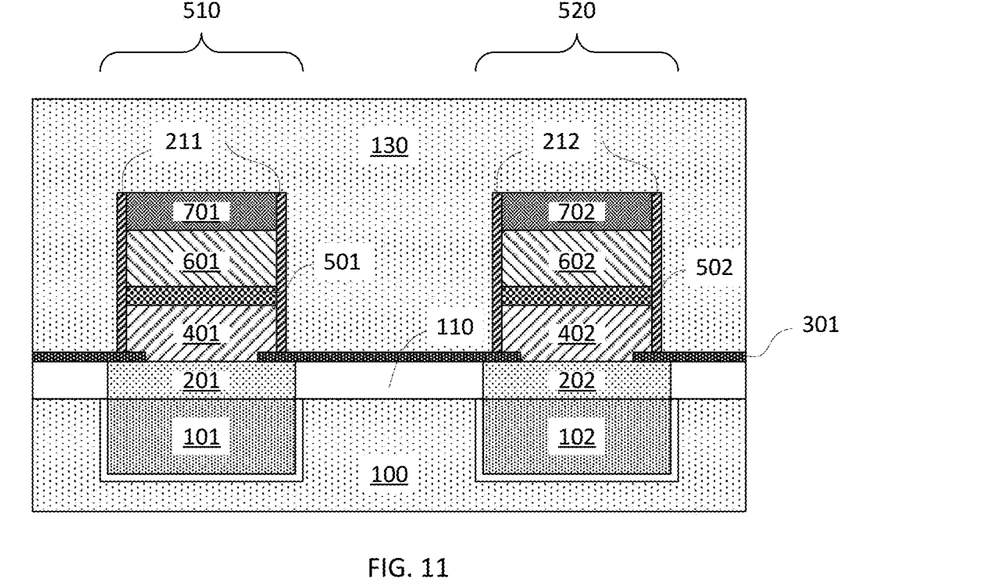

FIG. 11 is a demonstrative illustration of cross-sectional view of a MRAM structure in a step of manufacturing thereof, following the step illustrated in FIG. 10, according to one embodiment of present invention. More particularly, embodiments of present invention provide forming a third dielectric layer 130, which may be an interlevel dielectric layer (ILD) of low-k material, covering the first and second MTJ stacks 510 and 520. The third dielectric layer 130 covers sidewall spacers 211 and 212 and top surfaces of the first and second MTJ stacks 510 and 520 and in particularly top surfaces of the metal hard masks 701 and 702.

Figure 12:
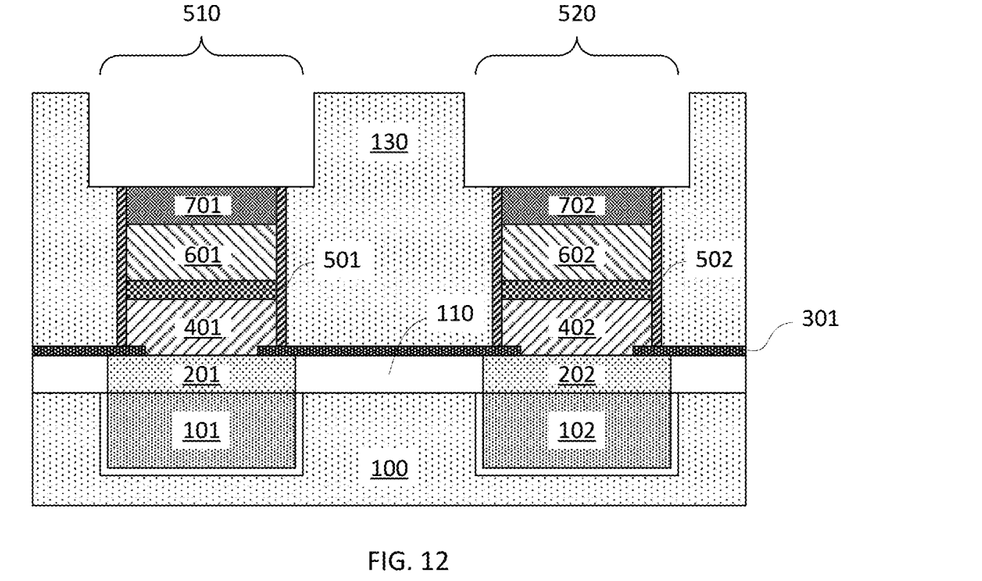

FIG. 12 is a demonstrative illustration of cross-sectional view of a MRAM structure in a step of manufacturing thereof, following the step illustrated in FIG. 11, according to one embodiment of present invention. More particularly, embodiments of present invention provide creating openings in the third dielectric layer 130 for forming top electrodes to the first and second MTJ stacks 510 and 520. For example, the openings may be created directly on top of, thereby exposing the top surfaces of the metal hard masks 701 and 702.

Figure 13:
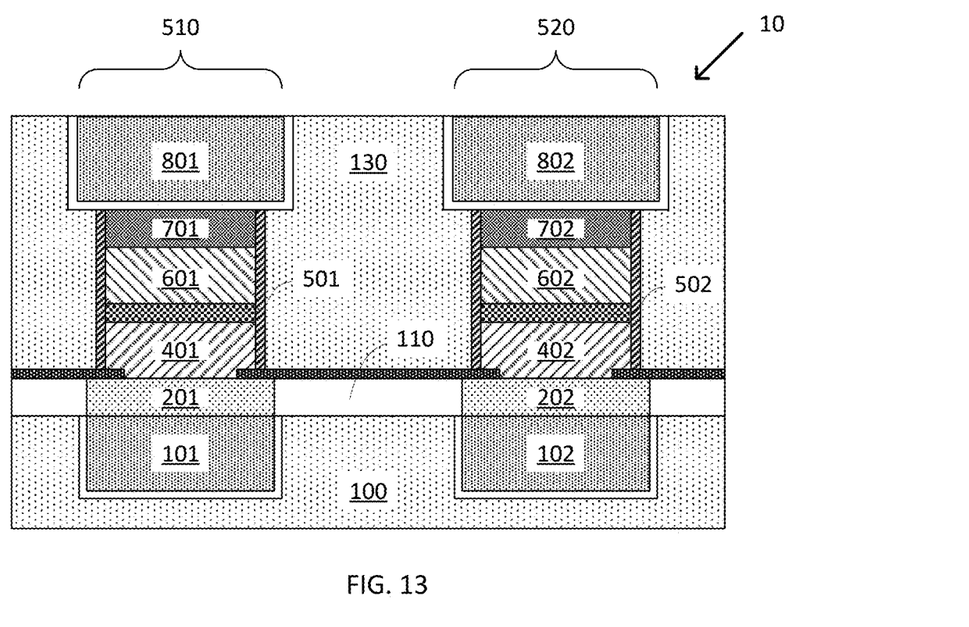

FIG. 13 is a demonstrative illustration of cross-sectional view of a MRAM structure in a step of manufacturing thereof, following the step illustrated in FIG. 12, according to one embodiment of present invention. More particularly, embodiments of present invention provide depositing conductive materials such as, for example, tungsten (W), copper (Cu), aluminum (Al), Ru, or cobalt (Co) in the openings in the third dielectric layer 130 above the metal hard masks 701 and 702 to form top electrode layers such as top electrode layers 801 and 802. The top electrode layers 801 and 802 may include liners lining the openings before the conductive materials are deposited. In one embodiment, the top electrode layers 801 and 802 may be a metal level, such as a metal level M3, M4, etc. of a BEOL structure.

Figure 14:
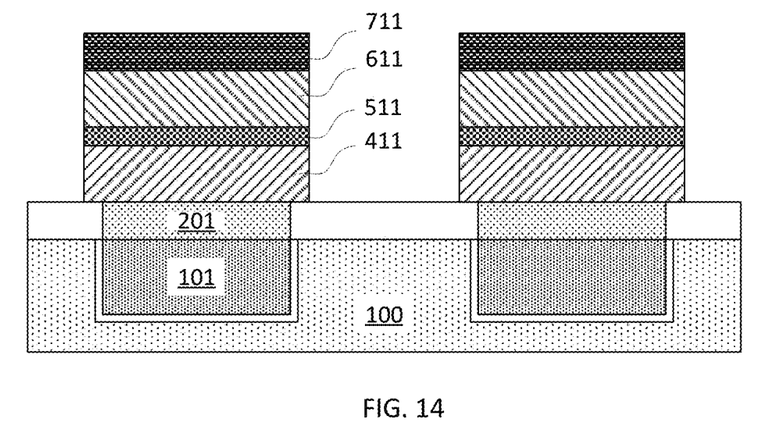
FIGS. 14-17 are demonstrative illustrations of cross-sectional views of a MRAM structure in a process of manufacturing thereof, following the step illustrated in FIG. 4, according to another embodiment of present invention.

FIG. 14 is a demonstrative illustration of cross-sectional view of a MRAM structure in a step of manufacturing thereof, following the step illustrated in FIG. 4, according to another embodiment of present invention. After the bottom electrode layers 201 and 202 have been formed on top of the bottom contacts 101 and 102 and surrounded by the second dielectric layer 110, embodiments of present invention provide forming a first ferromagnetic layer 411, a tunnel barrier layer 511, and a second ferromagnetic layer 611, on top of the bottom electrode layer 201, using a metal hard mask 711 in a deposition and anisotropic etching process. In one embodiment, the first ferromagnetic layer 411, the tunnel barrier layer 511, and the second ferromagnetic layer 611 may be formed in a process similar to that of forming the first MTJ stack 510 except that no etch-stop layer is used in this embodiment.

A person skilled in the art will appreciate that in the above embodiment, the first ferromagnetic layer 411, the tunnel barrier layer 511, and the second ferromagnetic layer 611 all have a horizontal width or size that is larger than that of the bottom electrode layer 201. Therefore, no etch-stop layer is needed because during the etching process of the first ferromagnetic layer 411, the bottom electrode layer 201 is fully covered by the first ferromagnetic layer 411. In other words, the bottom electrode layer 201 will not be etched, removing any concerns of causing possible re-sputtering of the conductive material of the bottom electrode layer 201.

Figure 15:
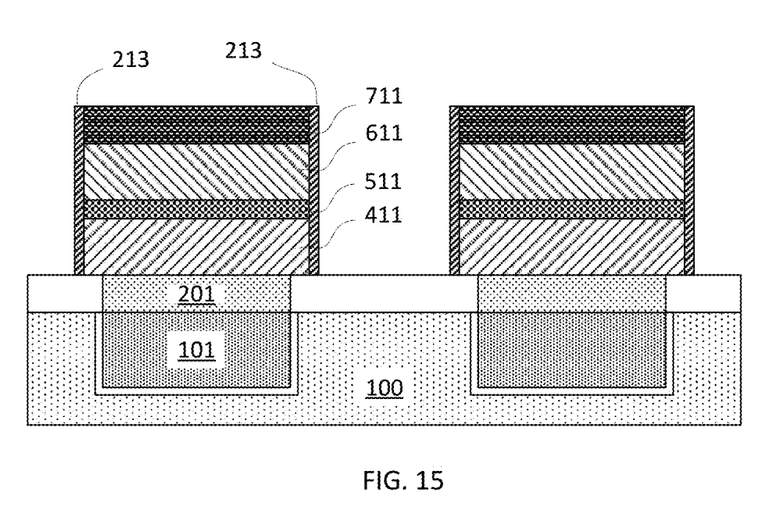

FIG. 15 is a demonstrative illustration of cross-sectional view of a MRAM structure in a step of manufacturing thereof, following the step illustrated in FIG. 14, according to another embodiment of present invention. More particularly, embodiments of present invention provide forming sidewall spacers 213 next to sidewalls of the first ferromagnetic layer 411, the tunnel barrier layer 511, the second ferromagnetic layer 611, and the metal hard mask 711.

Figure 16:
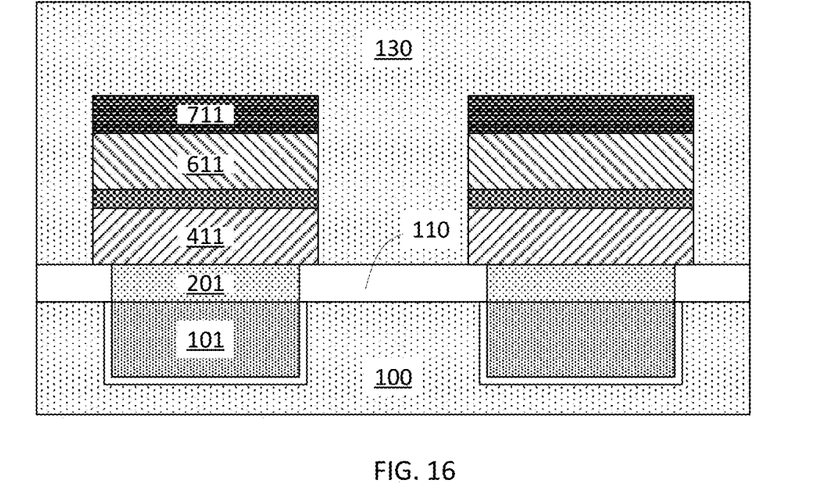

FIG. 16 is a demonstrative illustration of cross-sectional view of a MRAM structure in a step of manufacturing thereof, following the step illustrated in FIG. 15, according to another embodiment of present invention. More particularly, embodiments of present invention provide depositing a third dielectric layer 130 such as a low-k dielectric material cover the first ferromagnetic layer 411, the tunnel barrier layer 511, the second ferromagnetic layer 611, and the metal hard mask 711.

Figure 17:
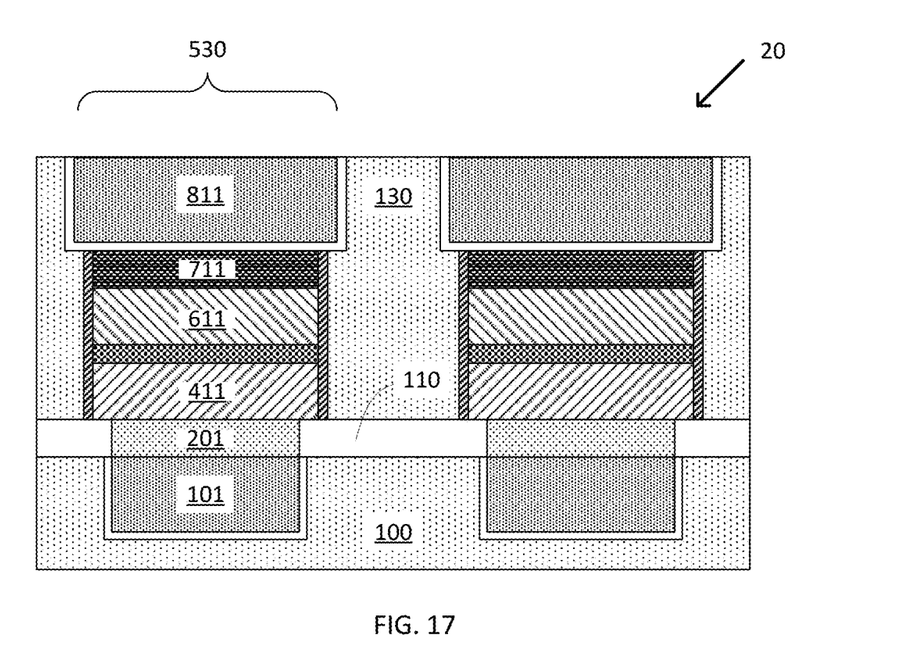

FIG. 17 is a demonstrative illustration of cross-sectional view of a MRAM structure in a step of manufacturing thereof, following the step illustrated in FIG. 16, according to another embodiment of present invention. More particularly, embodiments of present invention provide forming a top electrode layer 811 in the third dielectric layer 130 directly on top of the top surface of the metal hard mask 711, thereby forming a third MTJ stack 530.

Figure 18:
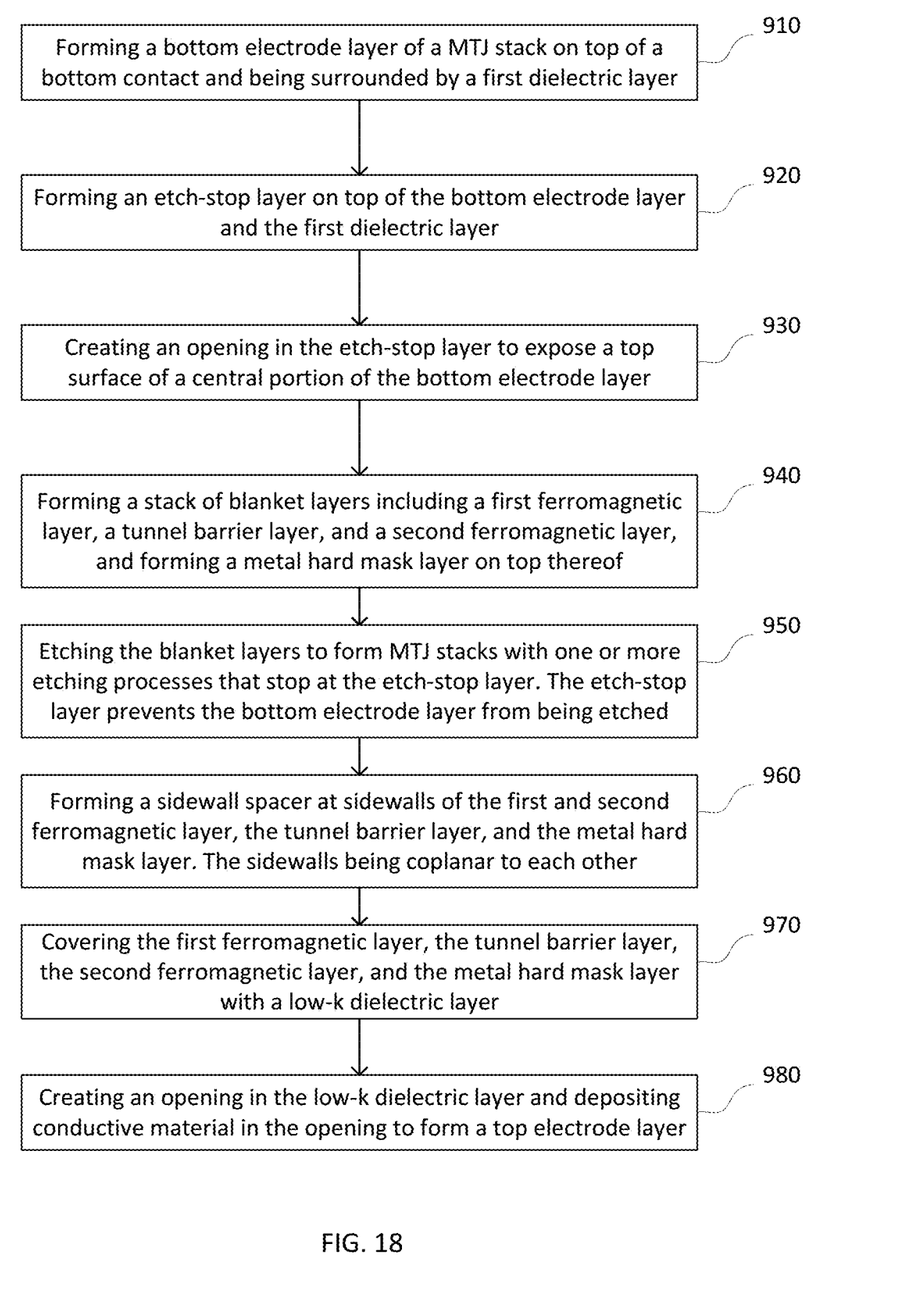
FIG. 18 is a demonstrative illustration of a flow-chart of a method of manufacturing a MRAM structure according to embodiments of present invention.

FIG. 18 is a demonstrative illustration of a flow-chart of a method of manufacturing a MRAM device according to embodiments of present invention. The method includes (910) forming a bottom electrode layer of a MTJ stack on top of a bottom contact with the bottom electrode layer being surrounded by a first dielectric layer; (920) forming an etch-stop layer on top of the bottom electrode layer and the first dielectric layer; (930) creating an opening in the etch-stop layer to expose a top surface of a central portion of the bottom electrode layer with a surrounding portion of the bottom electrode layer being covered by the etch-stop layer; (940) forming a stack of blanket layers including a first ferromagnetic layer, a tunnel barrier layer, and a second ferromagnetic layer, and forming a metal hard mask layer on top thereof; (950) etching the stack of blanket layers to form MTJ stacks with one or more etching processes that stop at the etch-stop layer, thereby the etch-stop layer prevents the bottom electrode layer from being etched which otherwise would cause device reliability concerns due to possible short caused by material re-sputtering; (960) forming a sidewall spacer at sidewalls of the first ferromagnetic layer, the tunnel barrier layer, the second ferromagnetic layer, and the metal hard mask layer. The sidewalls of the first ferromagnetic layer, the tunnel barrier layer, the second ferromagnetic layer, and the metal hard mask layer are coplanar to each other based on the etching process but not coplanar with a sidewall of the bottom electrode layer; (970) covering the first ferromagnetic layer, the tunnel barrier layer, the second ferromagnetic layer, and the metal hard mask layer with a low-k dielectric layer and (980) creating an opening in the low-k dielectric layer and depositing conductive material in the opening to form a top electrode layer.

It is to be understood that the exemplary methods discussed herein may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other high-level carrier) or in a multichip package (such as a ceramic carrier that has surface interconnections and/or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions of various embodiments of present invention have been presented for the purposes of illustration and they are not intended to be exhaustive and present invention are not limited to the embodiments disclosed. The terminology used herein was chosen to best explain the principles of the embodiments, practical application or technical improvement over technologies found in the marketplace, and to enable others of ordinary skill in the art to understand the embodiments disclosed herein. Many modifications, substitutions, changes, and equivalents will now occur to those of ordinary skill in the art. Such changes, modification, and/or alternative embodiments may be made without departing from the spirit of present invention and are hereby all contemplated and considered within the scope of present invention. It is, therefore, to be understood that the appended claims are intended to cover all such modifications and changes as fall within the spirit of the invention.

What is claimed is:

1. A MRAM structure comprising:
   a magnetic tunnel junction (MTJ) stack, the MTJ stack comprising, vertically from a bottom to a top thereof, a bottom electrode layer, a first ferromagnetic layer, a tunnel barrier layer, a second ferromagnetic layer, and a top electrode layer; and
   a dielectric layer between the bottom electrode layer and the first ferromagnetic layer,
   wherein the dielectric layer has an opening directly above the bottom electrode layer, and a portion of the first ferromagnetic layer is inside the opening and in contact with the bottom electrode layer,
   wherein a cross-sectional view of the first ferromagnetic layer has a T-shape with a horizontal portion of the T-shape being above the dielectric layer and a vertical portion of the T-shape being inside the opening of the dielectric layer.

2. The MRAM structure of claim 1, wherein the first ferromagnetic layer is a reference layer and the second ferromagnetic layer is a free layer.

3. The MRAM structure of claim 1, wherein the first ferromagnetic layer is a free layer and the second ferromagnetic layer is a reference layer.

4. The MRAM structure of claim 1, wherein the first and second ferromagnetic layers and the tunnel barrier layer share a common sidewall, wherein the common sidewall is not coplanar with a sidewall of the bottom electrode layer.

5. The MRAM structure of claim 4, further comprising a sidewall spacer, the sidewall spacer surrounding the common sidewall shared by the first and second ferromagnetic layers and the tunnel barrier layer.

6. A MRAM structure comprising:
   a magnetic tunnel junction (MTJ) stack, the MTJ stack comprising a bottom electrode layer, a first ferromagnetic layer, a tunnel barrier layer, a second ferromagnetic layer, and a top electrode layer; and a dielectric layer of silicon-carbonitride (SiCN) between the bottom electrode layer and the first ferromagnetic layer, wherein the dielectric layer has an opening directly above the bottom electrode layer, a portion of the first ferromagnetic layer filling the opening and being in contact with the bottom electrode layer, wherein a cross-sectional view of the first ferromagnetic layer has a T-shape with a horizontal portion of the T-shape being above the dielectric layer and a vertical portion of the T-shape being inside the opening of the dielectric layer.

7. The MRAM structure of claim 6, wherein the first ferromagnetic layer has a first sidewall, a height of the first sidewall being smaller than a height of the first ferromagnetic layer measured at a center thereof.

8. The MRAM structure of claim 7, wherein the first ferromagnetic layer has a second sidewall that is surrounded by the opening of the dielectric layer.

9. The MRAM structure of claim 7, wherein the first sidewall of the first ferromagnetic layer is substantially coplanar with sidewalls of the tunnel barrier layer and the second ferromagnetic layer.

10. The MRAM structure of claim 9, wherein the first sidewall of the first ferromagnetic layer is not coplanar with a sidewall of the bottom electrode layer.

11. The MRAM structure of claim 6, wherein the first ferromagnetic layer is either a reference layer or a free layer.

12. The MRAM structure of claim 6, further comprising a sidewall spacer, the sidewall spacer surrounding a common sidewall shared by the first and second ferromagnetic layers and the tunnel barrier layer; and the sidewall spacer being directly on top of the dielectric layer.

13. A method of forming a MRAM structure, the method comprising:

forming a bottom electrode layer, the bottom electrode layer being coplanar with a bottom dielectric layer that surrounds the bottom electrode layer;

forming an etch-stop layer on top of the bottom electrode layer and the bottom dielectric layer;

creating an opening in the etch-stop layer to expose a top surface of the bottom electrode layer;

forming a first ferromagnetic layer on top of the exposed top surface of the bottom electrode layer and on top of the etch-stop layer, with a portion of the first ferromagnetic layer filling the opening in the etch-stop layer;

forming a tunnel barrier layer and a second ferromagnetic layer on top of the first ferromagnetic layer;

patterning the second ferromagnetic layer, the tunnel barrier layer, and the first ferromagnetic layer; and forming a top electrode layer on top of the second ferromagnetic layer, wherein a cross-sectional view of the first ferromagnetic layer has a T-shape with a horizontal portion of the T-shape being above the etch-stop layer and a vertical portion of the T-shape being inside the opening of the etch-stop layer.

14. The method of claim 13, wherein patterning the second ferromagnetic layer, the tunnel barrier layer, and the first ferromagnetic layer comprises patterning the second ferromagnetic layer, the tunnel barrier layer, and the first ferromagnetic layer to have a common sidewall, wherein the common sidewall is not coplanar with a sidewall of the bottom electrode layer.

15. The method of claim 14, further comprising forming a sidewall spacer next to the common sidewall, wherein a bottom of the sidewall spacer directly contacts the etch-stop layer.

16. The method of claim 13, wherein the first ferromagnetic layer has a first sidewall and a second sidewall, the second sidewall being surrounded by the opening in the etch-stop layer and not coplanar with the first sidewall.

17. The method of claim 13, wherein patterning the second ferromagnetic layer, the tunnel barrier layer, and the first ferromagnetic layer comprises using the top electrode layer as a metal hard mask in an anisotropic etching process to etch the second ferromagnetic layer, the tunnel barrier layer, and the first ferromagnetic layer.

18. The method of claim 17, wherein the anisotropic etching process stops at the etch-stop layer, the etch-stop layer prevents the anisotropic etching process from further etching of the bottom electrode layer.

19. The method of claim 13, wherein forming the bottom electrode layer comprises forming the bottom electrode layer on top of a metal level of a back-end-of-line (BEOL) structure.

* * * * *